United States Patent

[11] 3,591,840

[72] Inventor Vincent J. Glinski
Murray Hill, N.J.
[21] Appl. No. 869,547
[22] Filed Oct. 27, 1969
[45] Patented July 6, 1971
[73] Assignee Bell Telephone Laboratories, Incorporated
Murray Hill, Berkeley Heights, N.J.
Continuation-in-part of application Ser. No. 786,228, Dec. 23, 1968.

[54] CONTROLLABLE SPACE-CHARGE-LIMITED IMPEDANCE DEVICE FOR INTEGRATED CIRCUITS

8 Claims, 10 Drawing Figs.

[52] U.S. Cl. .......... 317/235 R,
317/235 A, 317/235 D, 317/235 E, 317/235 G, 307/303, 317/235 AM, 317/235 X, 307/289
[51] Int. Cl. .......... H01l 19/00
[50] Field of Search .......... 317/235

[56] References Cited

UNITED STATES PATENTS

| | | | |
|---|---|---|---|
| 2,764,642 | 9/1956 | Shockley | 317/235 |
| 2,816,847 | 12/1956 | Shockley | 317/235 |
| 2,924,760 | 2/1960 | Herlet | 317/235 |
| 3,098,160 | 7/1963 | Noyce | 317/235 |
| 3,166,448 | 1/1965 | Hubner | 317/235 |
| 3,360,698 | 12/1967 | Warner et al. | 317/235 |
| 3,389,230 | 6/1968 | Hudson | 317/235 |

*Primary Examiner*—Jerry D. Craig
*Attorneys*—R. J. Guenther and Arthur J. Torsiglieri

ABSTRACT: A self-isolating, gate-controllable, space-charge-limited impedance device is provided for use advantageously in combination with other devices in semiconductor integrated circuits. In the impedance device, space-charge-limited current between a plurality of spaced surface zones is controlled by applying a potential to a surface layer through one or more electrodes.

INVENTOR
V. J. GLINSKI
BY
A. J. Torsiglieri
ATTORNEY

CONTROLLABLE SPACE-CHARGE-LIMITED IMPEDANCE DEVICE FOR INTEGRATED CIRCUITS

CROSS-REFERENCE TO RELATED APPLICATION

This application is a continuation-in-part of the copending U. S. Application Ser. No. 786,228, filed Dec. 23, 1968.

BACKGROUND OF THE INVENTION

This invention relates generally to semiconductor devices; and, more particularly, to semiconductor impedance devices for use advantageously in integrated circuits.

In my aforementioned copending application of which this is a continuation-in-part, there is disclosed an improved technique for providing PN junction isolation between functional elements in a monolithic semiconductor integrated circuit. Briefly, the functional element to be isolated is surrounded laterally by an annular surface zone which is arranged to cooperate with a high resistivity substrate such that the depletion region from the annular zone can be made to extend into the substrate and completely underneath the functional element. In this manner the functional element is completely contained within an integral isolating structure which comprises the annular zone and the depletion region therefrom.

In this type and in other types of integrated circuits it is often desired to provide a physically small, high impedance device.

SUMMARY of the INVENTION

To this and other ends, I have invented a physically small, self-isolated, gate-controllable, high impedance device which is compatible with the aforementioned isolation scheme and with other types of integrated circuits.

In one broad aspect my impedance device is characterized by nonlinear space-charge-limited current flow between a plurality of spaced surface zones of one type semiconductivity. If desired, current flow can be modulated through application of a suitable potential to a contiguous surface zone of the other type semiconductivity.

More specifically, an impedance device in accordance with my invention includes a semiconductor wafer comprising a relatively high resistivity bulk portion of the other type semiconductivity into which there is disposed a plurality of spaced surface zones of the one type semiconductivity. Those portions of the wafer surface between the spaced surface zones are of the other type semiconductivity, but are of relatively low resistivity compared with the bulk portion. It will be appreciated that PN junctions are formed between each spaced surface zone and the wafer portions contiguous therewith.

In operation, the space charge depletion regions from the PN junctions extend into the bulk portion and mutually intersect so that nonlinear space-charge-limited current flow between the spaced surface zones is enabled. This current flow is modulated by applying a modulating potential to the low resistivity surface portions of the other type semiconductivity.

A particular embodiment of my invention comprises a pair of the spaced surface zones, one of which is annular and encloses laterally the other. In this configuration, the depletion regions extend completely under the device which is thereby electrically isolated both laterally and vertically.

In another particular embodiment of my invention, the impedance device is formed in combination with a transistor of the type disclosed in my aforementioned copending application. In this advantageous combination, the collector zone of the transistor also serves as one of the spaced surface zones of the impedance device.

It is to be understood that throughout this specification, and in the claims, the terms "annular" and "annularlike" are not to be limited to circularlike structures, but include structures formed by or including straight line segments.

BRIEF DESCRIPTION OF THE DRAWING

The invention will be more clearly understood from the following more detailed description taken in conjunction with the drawing, in which.

Figure 1:
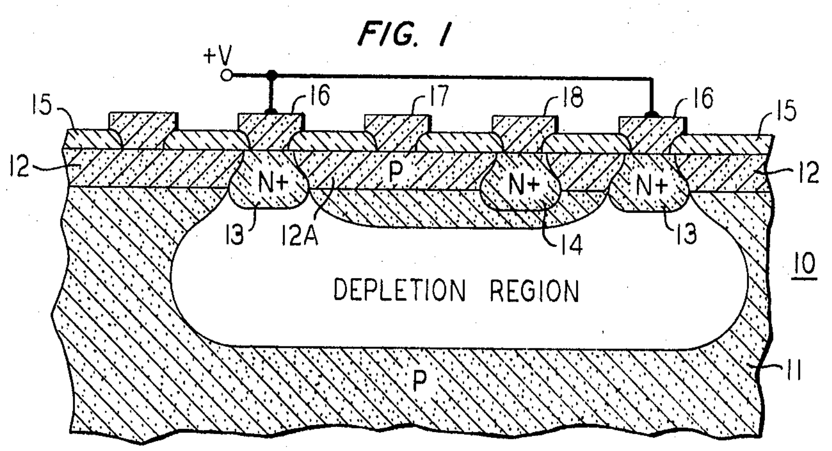
FIG. 1 shows a cross-sectional view of a self-isolated transistor in accordance with my invention, as disclosed in my aforementioned copending application.

It will be appreciated that for simplicity and clarity of explanation the figures of the drawing have not necessarily been drawn to scale.

DETAILED DESCRIPTION

With more specific reference to the drawing, the transistor shown in FIG. 1 is substantially as disclosed in my aforementioned parent application.

As shown in FIG. 1 the transistor is disposed in a semiconductive wafer 10 which includes a high resistivity bulk portion 11, e.g., of P-type conductivity. Bulk portion 11 usually is greater than 10 ohm-cm. and, advantageously, for many applications is greater than about 500 ohm-cm. Overlying bulk portion 11 is a more heavily doped layer 12, the bulk of which is of P-type conductivity and which includes a plurality of spaced localized surface zones 13 and 14. The precise doping and thickness of the P-type portion of layer 12 may be varied over a considerable range of values; however, a resistivity of about 500 ohms per square and a thickness of about 1 micron are considered typical. Zone 13, an annular collector zone, encloses zone 14, an emitter zone, and determines the lateral extent of a base zone which includes a portion 12A of the more heavily doped P-type layer 12. Electrodes 16, 17, and 18 provide electrical contact to the surface zones 13, 12A, and 14, respectively.

In operation the junctions formed by the annular collector zone with the contiguous P-type material are reversed-biased so that the depletion region extending from opposite sectors of the annular junction mutually intersect in the bulk 11, as shown in FIG. 1. In this condition, the depletion region extends completely underneath all of the semiconductive material enclosed by annular zone 13. It will be appreciated that once this depletion region so extends, the enclosed material is electrically isolated from the semiconductive material outside the enclosure in a manner similar to the more conventional forms of back-to-back diode isolation.

Figure 2:
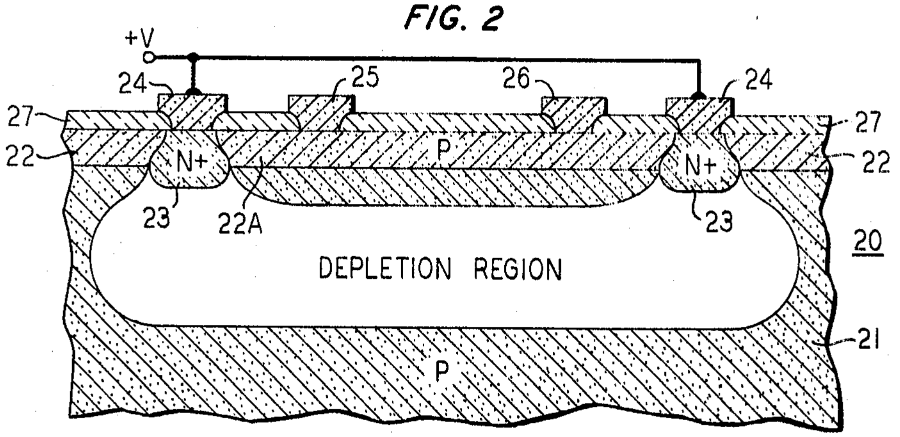
FIG. 2 shows a cross-sectional view of a simple resistor isolated in accordance with the principles of my invention.

FIG. 2 shows a cross section of a resistor isolated by a depletion region structure such as shown in FIG. 1. As in FIG. 1, a wafer portion 20 includes a P-type bulk portion 21 underlying a more heavily doped layer 22, the bulk of which layer is of a more heavily doped P-type material. N-type annular zone 23 extending at least partially through layer 22 determines the lateral extent of the resistor body, a portion 22A of layer 22.

Electrode 24 provides electrical contact to the isolating annular zone 23 to enable application of a positive voltage (+V)

with respect to the bulk 21 to cause the depletion region to form as shown in FIG. 2. Resistor electrodes 25 and 26 are shown contiguous with resistor body 22A. Once layer 12 has been formed, the resistance which is exhibited between the resistor electrodes is determined primarily by the distance between, and the configuration of, those resistor electrodes, all in accordance with principles well known in the art. As with the transistor of FIG. 1, electrical isolation for the resistor is provided by the combination of the depletion region (so labeled) and the N-type zone 23 from which it extends.

Unfortunately, this and conventional, substantially ohmic, semiconductive resistors have two basic limitations which cause them to appear unattractive for many circuit applications. One of these limitations is that there is a practical upper bound on the resistance obtainable, consistent with the criteria of physical size and the semiconductive doping compatible with other devices within the integrated circuit of which it is a part. The other basic limitation is the absence of a means for providing electronic controllability of the resistance exhibited.

Figure 3:
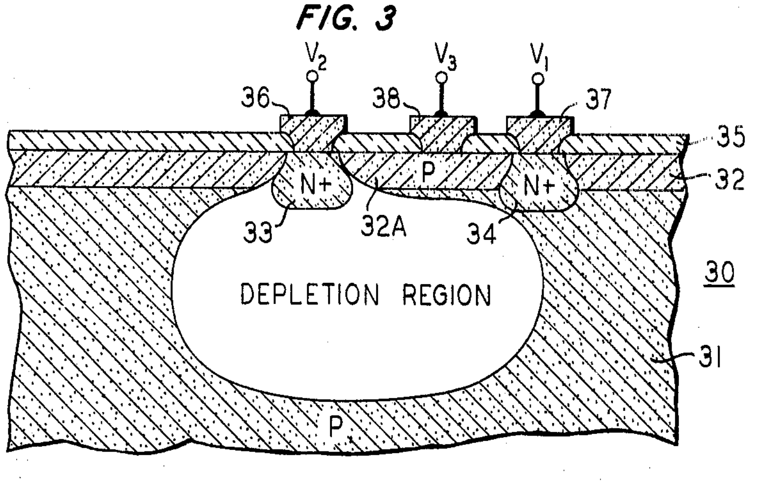
FIG. 3 shows a cross-sectional view of a particular embodiment of a self-isolated, gate-controllable, space-charge-limited impedance device in accordance with my invention.

With a view toward solving these and other problems and toward providing an electronically controllable impedance device of general utility to the art, I show in FIG. 3 a cross section of a basic embodiment of a self-isolating, gate-controllable space-charge-limited impedance device in accordance with my invention. This device is intended to be compatible with devices such as shown in FIGS. 1 and 2, and to that end FIG. 3 illustrates a wafer portion 30 which includes a high resistivity bulk portion 31 underlying a more heavily doped layer 32, the bulk of which is of a more heavily doped P-type semiconductivity. A pair of spaced $N^+$-type surface zones 33 and 34 extends at least partially through layer 32 and at least partially determines the lateral extent of a portion 32A of layer 32. Electrodes 36, 37, and 38 provide electrical contact to zones 33, 34, and 32A, respectively.

The relative spacings and the relative resistivities of zones 33 and 34, of layer 32, and of bulk portion 31 are arranged such that with the junctions reversed-biased by some amount less than avalanche breakdown, the depletion regions extending from zones 33 and 34 mutually intersect underneath the semiconductive material determined therebetween.

In operation one of the N-type zones, for example, zone 33 as shown in FIG. 3, is made sufficiently positive with respect to the other N-type zone or with respect to the contiguous P-type material so that the depletion region therefrom extends into the bulk portion and merges with the depletion region from the other N-type zone. Once the depletion regions have merged a space-charge-limited current can be made to flow from one of these zones to the other. Inasmuch as space-charge-limited current flow is characterized by a nonlinear, inherently high impedance, this characteristic may be utilized to provide a physically small, high impedance, e.g., in the range of 1,000 to 200,000 ohms between such zones.

Upon application of a negative voltage to electrode 38, some of the electric field lines in the space-charge depletion region tend to terminate on P-type zone 32A, which is at an equipotential with electrode 38. This tends to diminish space-charge-limited current flow, which in turn causes the device to exhibit a higher impedance. Considered from another point of view, the application of a potential to "gate" electrode 38 may be thought of as tending to modulate emission of current carriers from the N-type surface zones into the space-charge depletion region. From this point of view a negative potential applied to the gate electrode tends to diminish such emission and thus causes the device to exhibit a higher impedance.

In a particular embodiment which was fabricated and tested, the bulk was about 500 ohm-cm.; and the more heavily doped P-type layer was diffused to a depth of about 1 micron and to a surface concentration of about $10^{18}$ atoms of boron per cubic centimeter. The spaced surface zones were each rectangular in shape, 50 microns long and 3 microns apart at all points. In this device the impedance was about 8,000 ohms with the gate electrode floating. As negative voltage was applied to the gate electrode, the impedance increased nonlinearly to about 70,000 ohms at a negative gate potential of about 2.8 volts.

A particularly advantageous feature of the device shown in FIG. 3 is that the relatively heavily doped surface portions 32 and 32A, contiguous with zones 33 and 34, prevent any significant portion of the space-charge depletion region from approaching the surface of the device. This is of particular importance since surface recombination processes would deleteriously affect the device by increased parasitic leakage currents should any significant portion of these space-charge depletion region intersect the surface.

A device of the class of devices shown in FIG. 3 may be fabricated by any of a variety of ways which will be apparent to those in the art. However, two particular fabrication procedures will be discussed briefly.

One method for fabricating a device such as shown in FIG. 3, in accordance with the methods set forth in my aforementioned parent application, begins with the nonselective introduction of P-type impurities into the surface of high resistivity bulk portion 31 to form layer 32. Then zones 33 and 34 are formed by a selective introduction of N-type impurities into and at least partially through selected portions of layer 32. Solid state diffusion or ion implantation or any of a variety of techniques well known in the art may be used for these introductions of impurities. This first method offers processing simplicity but will not be the most desirable for some applications if diffusion is used.

Diffusion of the N-type impurities through the P-type layer causes a well-known "push-out" of P-type impurities ahead of the N-type impurities. The "pushed-out" P-type impurities which then lie below the N-type impurities create the possible problem that more applied voltage is required to form the desired depletion region. This in turn causes a voltage offset in the impedance characteristic which may be disadvantageous for some applications, particularly low voltage circuit applications.

This problem can be avoided by fabricating the device by the following method. There is first formed over bulk portion 31 an oxide doped with P-type impurities; then voids are formed in the oxide layer to enable subsequent diffusion of N-type impurities to form zones 33 and 34. The heat treatment associated with this N-type diffusion causes the P-type impurities to diffuse from the oxide into the semiconductor, resulting in a structure such as shown in FIG. 3. For this process the impurities advantageously are selected so that the N-type impurities diffuse faster than the P-type impurities at a given temperature.

Of course if ion implantation is used for the introduction of impurities, this problem can be completely avoided.

Figure 4:
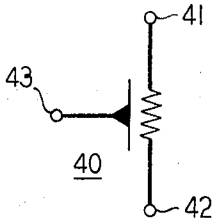
FIGS. 4 and 5 show the symbols which will be used to represent my impedance device in circuit schematic diagrams.
Figure 5:
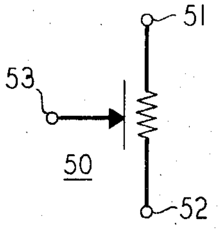

With reference now to FIGS. 4 and 5, there are shown the circuit symbols which will be used to represent a device of the general type shown in FIG. 3. With symbol 40 in FIG. 4 the impedance is exhibited between terminals 41 and 42; and terminal 43 represents the control terminal, also termed the gate terminal hereinbelow. The arrow pointing toward the gate terminal indicates the direction in which the minimal positive gate current would flow upon application of a gate voltage which tends to increase the impedance exhibited between terminals 41 and 42. For example, for a device with the semiconductivity types shown in FIG. 3, a negative gate voltage is applied to increase the impedance. Application of a negative voltage to terminal 43 necessarily implies that a positive current would tend to flow out of the device, i.e., toward terminal 43.

Similarly, symbol 50 in FIG. 5 represents a device in which the semiconductivity types are interchanged with respect to those shown in FIG. 3. For this type device a positive gate voltage would tend to increase the impedance exhibited between terminals 51 and 52 and so for this type device, the arrow points away from gate terminal 53.

Figure 6:
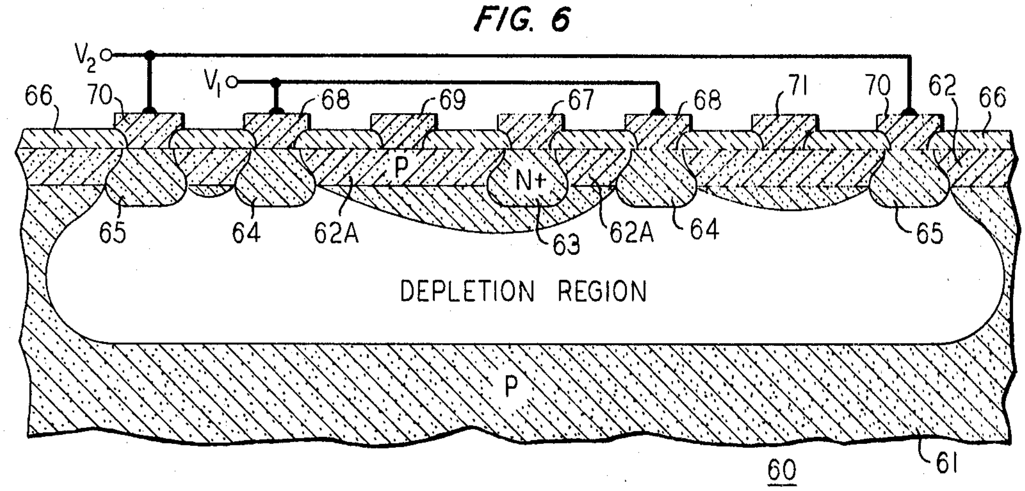
FIG. 6 shows a cross-sectional view of an impedance device in combination with a transistor in accordance with my invention.
Figure 7:
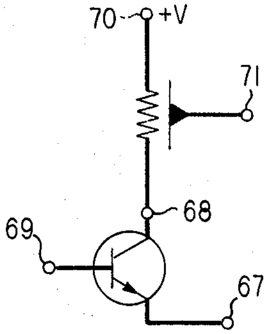
FIG. 7 shows the circuit schematic representation of the combination in FIG. 6.
Figure 8:
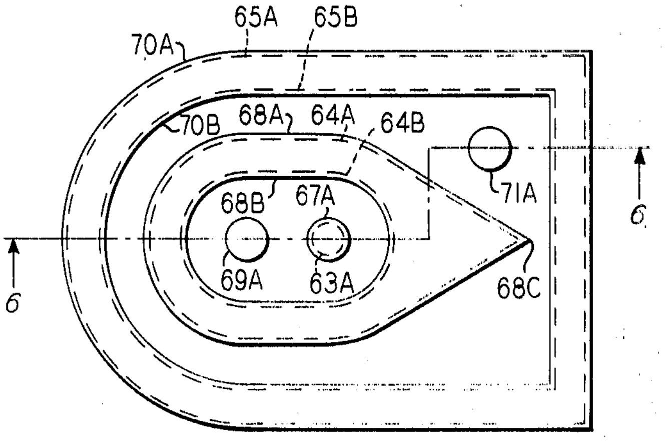
FIG. 8 shows one possible plan view of a combination such as shown in FIG. 6.

With reference to FIG. 6 there is shown a cross section of a compound semiconductor device formed by an advantageous combination of a transistor such as shown in FIG. 1 and a space-chargedlimited impedance device, such as shown in FIG. 3. A circuit schematic representation of the compound device is shown in FIG. 7; and one possible plan view of this type device is shown in FIG. 8. Wherever feasible, the same reference numerals have been used to indicate corresponding features within FIGS. 6, 7, and 8.

As with the above described structures, the compound device of FIG. 6 includes a high resistivity P-type bulk portion 61 overlying which there is a more heavily doped layer 62, the bulk of which is also of P-type semiconductivity. A plurality of spaced N-type surface zones in combination with the depletion regions extending therefrom define the functional zones of the device.

More specifically, zone 63 provides an emitter zone for the transistor. Annular zone 64 provides a collector zone and also determines the lateral extent of a base zone 62A of the transistor. Annular zone 65 provides one of the spaced surface zones for the impedance device; and annular collector zone 64 provides the other surface zone for the impedance device.

This is an example of true functional integration inasmuch as a single semiconductive zone 64 is serving multiple purposes, i.e., as a collector of a transistor and as a part of the impedance device. This is highly desirable in semiconductor integrated circuits because a considerable saving in physical space is realized in this manner.

As shown in FIG. 6 with suitable biasing voltages $V_1$ and $V_2$ applied through electrodes 68 and 70 to zones 64 and 65, respectively, a continuous space-charge depletion region extends completely under the entire device and simultaneously serves as a functional part of the device and as electrical isolation therefor.

It will be appreciated that several impedance devices may be formed in parallel with each other and in series with the collector of a transistor simply by a suitable disposition of a plurality of spaced N-type surface zones. In this case the collector zone of the transistor may simultaneously serve as a collector and as one of the surface zones for each of the plurality of impedance devices connected thereto.

With more specific reference now to FIG. 8, solid line patterns represent the electrodes shown in FIG. 6 and broken lines depict the metallurgical position of the PN junctions beneath the surface of the device. Accordingly, broken line patterns indicate the boundaries of the various semiconductive zones within the device. It will be appreciated that FIG. 8 is drawn to a reduced scale with respect to FIG. 6.

In FIG. 8 the pattern formed by lines 70A and 70B represent electrode 70 in FIG. 6. Broken lines 65A and 65B represent the boundaries of annular semiconductive zone 65. The pattern formed between lines 68A and 68B represents electrode 68 in FIG. 6. Broken lines 64A and 64B indicate the boundaries of zone 64. The pattern formed by line 69A indicates the base electrode 69. The pattern formed within line 67A represents emitter electrode 67; and the pattern formed within line 63A represents emitter zone 63. The pattern formed within line 71A represents the gate electrode 71.

It will be noted that line 68A forms a point 68C at that position where it is closest to line 70B. This point causes a localized concentration of electric field lines and thus enables a greater space-charge-limited current flow between zones 65 and 68 at this point. This feature may or may not be used as desired in particular applications.

Figure 9:
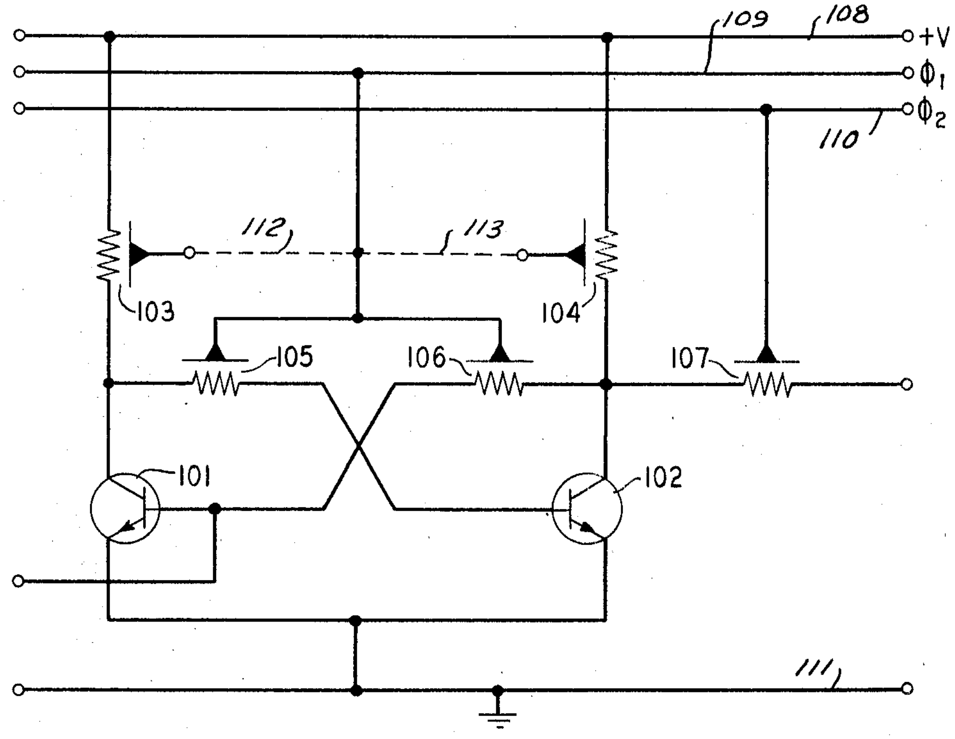
FIG. 9 shows a circuit schematic diagram of a digital information storage stage, intermediate in a cascade of like stages, employing impedance devices in accordance with my invention.

With reference now to FIG. 9, there is shown a circuit schematic diagram of a digital information storage stage, intermediate in a cascade of like stages, employing space-charge-limited impedance devices in accordance with my invention. As shown, the stage includes a pair of cross-coupled bipolar transistors 101 and 102, e.g., of the type shown in FIG. 1. The emitters of the bipolar transistors are coupled together and to a common control line 111 which is maintained normally at a fixed reference potential, e.g., ground. The collectors of the bipolar transistors are coupled separately through space-charge-limited devices 103 and 104 to a common power supply line 108 which in turn is connected to a source of positive voltage (+V). The collector of transistor 101 is coupled to the base of transistor 102 through space-charge-limited device 105; and a collector of transistor 102 is coupled to the base of transistor 101 through space-charge-limited device 106. The collector of transistor 102 additionally is coupled through an isolating space-charge-limited impedance device 107 to the input of the next succeeding stage.

Figure 9A:
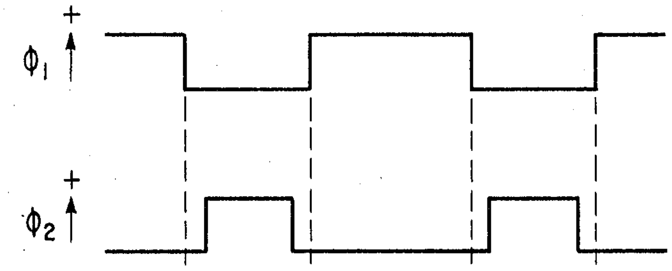
FIG. 9A represents the voltage waveforms of clock pulses advantageously used to manipulate information through the cascade represented in FIG. 9.

The gate electrodes of cross-coupling devices 105 and 106 are connected together and to a first control line 109, the potential on which is designated $\Phi_1$. As shown by the voltage wave forms represented in FIG. 9A, $\Phi_1$ is maintained normally at a relatively positive voltage so that devices 105 and 106 exhibit relatively low impedances; and transistors 101 and 102 thereby are normally effectively cross-coupled.

The gate electrodes of space-charge-limited devices 103 and 104 may be left floating or may be connected together and to the first control line 109 as indicated by phantom lines 112 and 113, as will be appreciated by those in the art. The choice will, of course, depend upon the impedance characteristic desired for the particular application to which the storage arrangement is intended.

The gate of isolation device 107 is connected to a second control line 110, the potential on which is designated $\Phi_2$. $\Phi_2$ normally is maintained at a relatively negative voltage so that a device 107 normally exhibits a relatively very high impedance so that the stage is effectively decoupled or isolated from the next succeeding stage.

To shift information from one stage to the next, $\Phi_1$ is first decreased to a relatively negative voltage to effectively decouple transistors 101 and 102; and then $\Phi_2$ is increased to a relatively positive voltage to cause device 107 to assume a relatively low impedance value. In this condition an information signal present at the collector of transistor 102 can be coupled through the low impedance of device 107 to the input of the next succeeding stage. Once the transfer is completed, $\Phi_2$ first is returned to its normally more negative voltage and then $\Phi_1$ is returned to its normally more positive voltage.

Although the invention has been described in terms of certain specific embodiments, it will be understood that other arrangements may be devised by those skilled in the art which likewise fall within the spirit and scope of the invention. For example, it will be appreciated that none of the spaced surface zones in my space-charge-limited impedance device need by annular in configuration unless the self-isolating feature resulting from the annular form is desired. Additionally, it will be appreciated that devices may be fabricated with semiconductivity types interchanged with respect to those shown in the drawing.

Still further, it will be appreciated that nonlinear space-charge-limited impedance devices in accordance with my invention advantageously are used also in semiconductor memory cells, particularly in cells of the type disclosed in U. S. Pat. No. 3,541,531, issued Nov. 17, 1970 in the names of J. E. Iwersen, B. T. Murphy, and J. H. Wuorinen, Jr. and assigned to the assignee hereof. In the Iwersen et al. cell, the read-write currents are, to some degree, interrelated with the standby current since all these currents flow through the same load impedances. The use of my space-charge-limited devices as load impedances therein reduces the disadvantageous effects of that current interrelation because, in accordance with the nonlinear characteristics of my devices, impedance decreases with increased applied voltage.

What I claim is:

1. A compound circuit device including a controllable space-charge-limited impedance element in series with a bipolar transistor comprising a body of semiconductor material comprising:

- a relatively high resistivity bulk portion of one type semiconductivity;
- a first surface zone of the other type semiconductivity providing an emitter zone for the transistor;

a second surface zone of the other type semiconductivity spaced from the first zone, the second zone providing a collector zone for the transistor and simultaneously providing one of two surface zones for the impedance element;

a first relatively low resistivity surface portion of the one type semiconductivity disposed between the first and second surface zones and delimited in lateral extent thereby, said first surface portion providing a base zone for the bipolar transistor;

a third surface zone of the other type semiconductivity spaced from the second zone, said third zone providing the other of two surface zones for the impedance element;

a second relatively low resistivity surface portion of the one type semiconductivity disposed between the second zone and the third zone and delimited in lateral extent thereby, said second surface portion providing a control zone for the impedance element; and first, second, third, fourth, and fifth electrodes providing electrical connection, respectively, to the emitter zone, to the base zone, to the collector zone, to the control zone, and to the other zone of the two surface zones for the impedance element;

each of the first, second, and third surface zones defining first, second, and third PN junctions, respectively, with contiguous material of the one type semiconductivity.

2. A device as recited in claim 1 wherein the second spaced surface zone is annular in configuration.

3. A device as recited in claim 2 wherein the third spaced surface zone is annular in configuration.

4. A device as recited in claim 2 wherein the second spaced surface zone encloses laterally the first spaced surface zone.

5. A device as recited in claim 1 wherein the third spaced surface zone is annular in configuration.

6. A device as recited in claim 5 wherein the third spaced surface zone encloses laterally the first and second spaced surface zones.

7. A device as recited in claim 6 wherein the second spaced surface zone is annular in configuration.

8. A device as recited in claim 7 where the second spaced surface zone encloses laterally the first spaced surface zone.